(12) United States Patent  
Chegeni et al.

(10) Patent No.: US 9,742,415 B1  
(45) Date of Patent: Aug. 22, 2017

(54) APPARATUS FOR LINEARIZING A DIFFERENTIAL CHARGE PUMP

(71) Applicant: Quantenna Communications, Inc., Fremont, CA (US)

(72) Inventors: Shirin Chegeni, Sunnyvale, CA (US); Koushik Krishnan, San Jose, CA (US)

(73) Assignee: Quantenna Communications, Inc., Fremont, CA (US)

( * ) Notice: Subject to any disclaimer, the term of this patent is extended or adjusted under 35 U.S.C. 154(b) by 0 days.

(21) Appl. No.: 15/281,736

(22) Filed: Sep. 30, 2016

(51) Int. Cl.
*H02M 3/07* (2006.01)
*H03L 7/089* (2006.01)
*H03L 7/099* (2006.01)

(52) U.S. Cl.
CPC ............ *H03L 7/0891* (2013.01); *H02M 3/07* (2013.01); *H03L 7/099* (2013.01)

(58) Field of Classification Search
CPC ......... H03L 7/0891; H03L 7/099; H02M 3/07
USPC ........................................ 327/535, 536, 537
See application file for complete search history.

(56) References Cited

U.S. PATENT DOCUMENTS

| | | | |
|---|---|---|---|
| 5,477,198 A | 12/1995 | Anderson et al. | |
| 5,559,473 A | 9/1996 | Anderson et al. | |
| 6,169,458 B1 * | 1/2001 | Shenoy | H03L 7/0896 327/111 |
| 6,941,116 B2 | 9/2005 | Jenson et al. | |
| 7,015,766 B1 | 3/2006 | Guo et al. | |
| 7,936,223 B2 | 5/2011 | Little et al. | |
| 8,368,443 B1 | 2/2013 | Su | |
| 8,766,683 B2 | 7/2014 | Houdebine et al. | |
| 2011/0037523 A1 | 2/2011 | Roine et al. | |
| 2013/0099852 A1 * | 4/2013 | Chen | H03L 7/0893 327/536 |

OTHER PUBLICATIONS

Scott Meninger, M. Perrott; "Sigma-Delta Fractional-N Frequency Synthesis"MIT, Jun. 7, 2004.
"Fundamentals of Phase Locked Loops (PLLs)", Analog Devices, Rev 0, Oct. 2008, MT-086 Tutorial.

* cited by examiner

*Primary Examiner* — John Poos
(74) *Attorney, Agent, or Firm* — IP Creators; Charles C. Cary

(57) ABSTRACT

A charge pump and a differential phase locked loop incorporating the charge pump. The charge pump includes a differential charge pump and an auxiliary charge pump. The differential charge pump has differential inputs and primary and mirror outputs. The differential charge pump is responsive to a down signal at the differential inputs to provide a negative current at the primary output and a positive current at the mirror output, and further responsive to an up signal at the differential inputs to provide a positive current at the primary output and a negative current at the mirror output. The auxiliary charge pump has differential inputs and an auxiliary output coupled to the mirror output of the differential charge pump. The differential charge pump is responsive to the down signal at the differential inputs to provide a negative current at the auxiliary output, and responsive to the up signal at the differential inputs to provide a positive current at the auxiliary output.

4 Claims, 3 Drawing Sheets

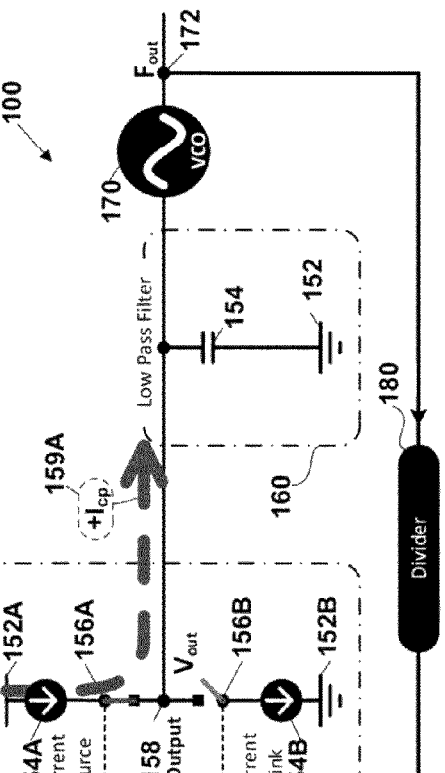
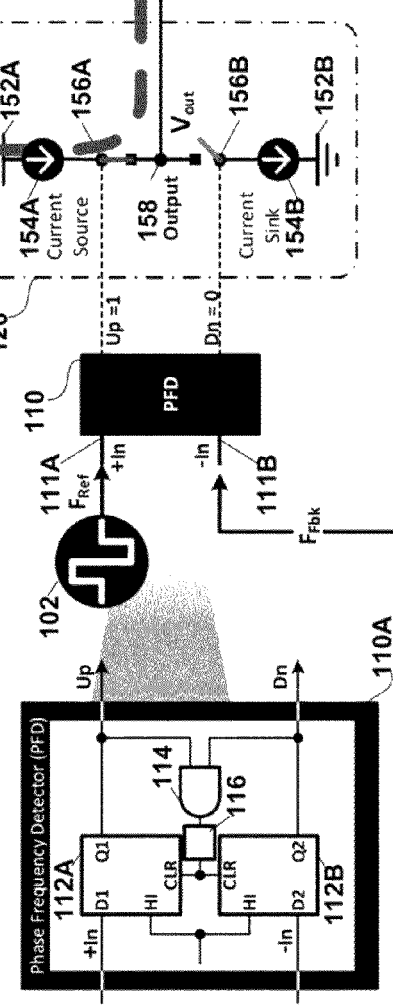
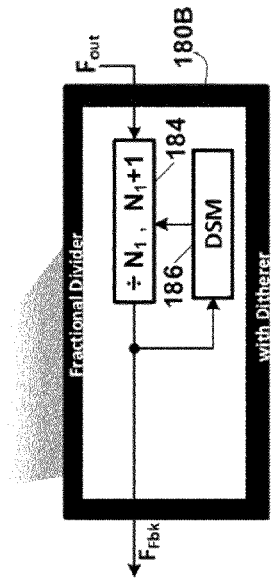
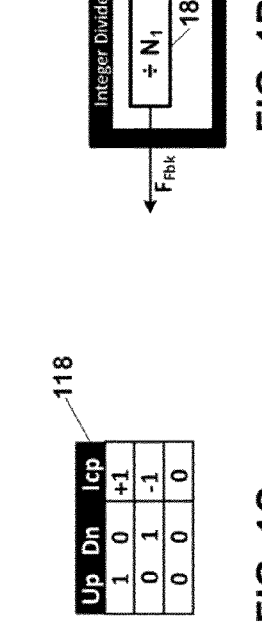

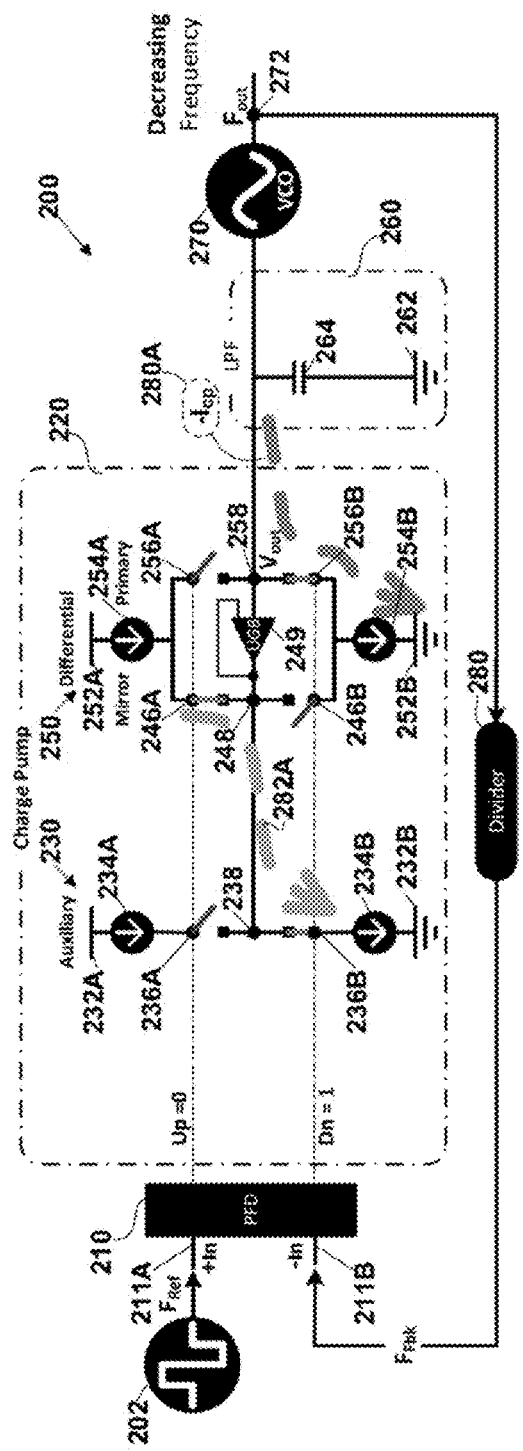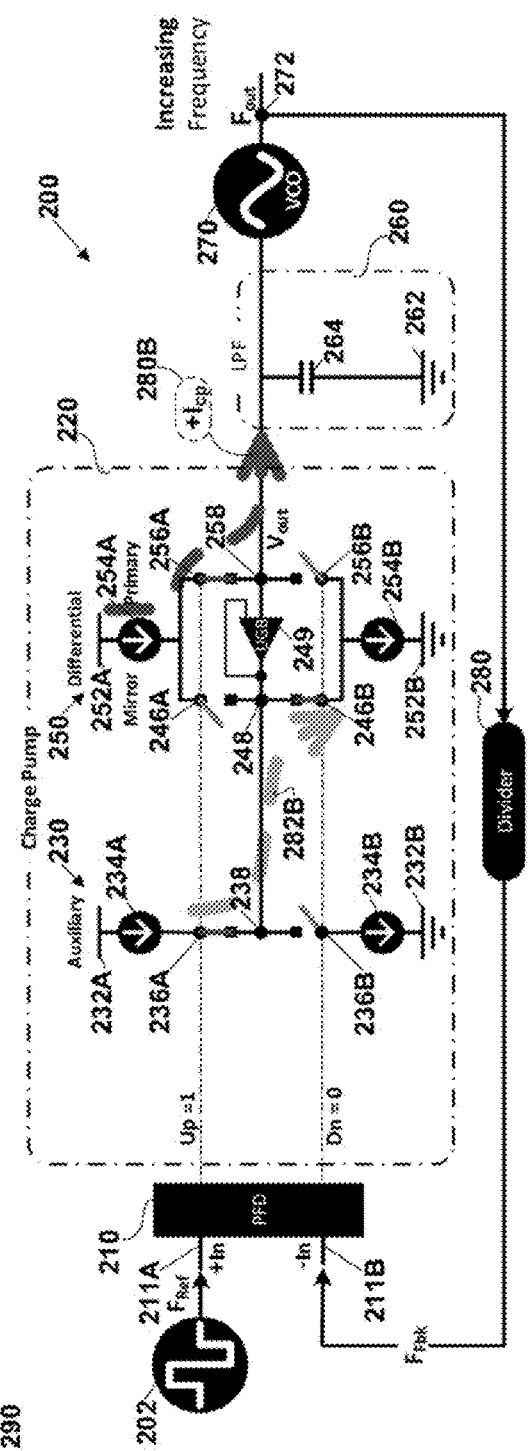

APPARATUS FOR LINEARIZING A DIFFERENTIAL CHARGE PUMP

BACKGROUND OF THE INVENTION

1. Field of Invention

The field of the present invention relates in general to phase-locked loop circuitry and in particular to a charge pump suitable for use in phase-locked loops.

2. Description of the Related Art

A phase locked loop (PLL) is a closed loop feedback system that in its simplest form, generates an error signal proportional to the phase difference between a fixed reference signal and the oscillations output by a voltage controlled oscillator (VCO) and which use the error signal to drive the VCO in a direction which reduces the phase errors. In its most basic implementation a PLL includes: a phase frequency detector (PFD), a charge pump (CP), a low pass filter (LPF), and a Voltage/Current controlled oscillator VCO. The PFD accepts input from the fixed reference signal and feedback of the variable signal output by the VCO, and provides the error signal as an output. The PFD error signal, either common mode or differential, is used to drive the charge pump. The charge pump operates as a bipolar current source converting the error signal from the PFD into positive and negative current pulses which are attenuated by the LPF before driving the VCO in a direction which reduces any measured phase error between the reference and feedback signal.

In a typical application a PLL is used to synthesize a high frequency VCO output signal from a lower frequency fixed reference signal. Clock synthesizers, switching regulators and Radio Frequency (RF) transceivers incorporate PLLs with this capability. Where the high desired high frequency VCO output signal is a fixed integer multiple of the fixed reference signal, the PLL will include a fixed integer frequency divider in the feedback path between the VCO output and the input of the PFD. Where the VCO output needs to be altered between two or more center frequencies associated with corresponding communication channels serviced by the RF transceiver, the frequency divider will have a selectable denominator "N" by which the feedback signal will be down scaled. The selection of denominators corresponds with the selection of a communication channel.

Where the center frequencies of the channels serviced by the RF transceiver are not integer multiples of the reference signal frequency the frequency divider may be a fractional divider with a selectable denominator. In these implementations a ditherer may also be added to smooth out any periodic spikes in the fractional divide by values which would otherwise result in periodic shifts of the VCO output phase by more than an entire wavelength. The ditherer may include both a frequency divider and an accumulator with the accumulator accumulating the least significant bits (LSB) of the divider's quotient and feeding them back into the numerator subsequently input to the frequency divider. A more complex ditherer may include both integer and fractional frequency dividers and a sigma-delta module rather than an accumulator to perform the dithering. The sigma-delta module typically adds a random sequence to the LSB of either the numerator or the quotient of one of the frequency dividers to shape the high frequency characteristics of the PLL.

For Fractional PLL's any non-linearity in any component is magnified by the scale factor between the low frequency reference signal and the high frequency VCO output signal frequency. The higher the scale factor, the more critical the errors induced by non-linearity become. Conventional charge pump design suffers from nonlinearity due to short switching pulses and the time constant for the sub-blocks to settle to its steady state. Charge pump linearity also suffers due to change in the source and sinks current differing as a function of input signal.

What is needed are improved circuits for improving the linearity of a charge pump.

SUMMARY OF THE INVENTION

The invention provides a charge pump and a differential phase locked loop incorporating the charge pump. In an embodiment of the invention the charge pump includes a differential charge pump and an auxiliary charge pump. The differential charge pump has differential inputs and primary and mirror outputs. The differential charge pump is responsive to a down signal at the differential inputs to provide a negative current at the primary output and a positive current at the mirror output, and further responsive to an up signal at the differential inputs to provide a positive current at the primary output and a negative current at the mirror output. The auxiliary charge pump has differential inputs and an auxiliary output coupled to the mirror output of the differential charge pump. The differential charge pump is responsive to the down signal at the differential inputs to provide a negative current at the auxiliary output, and responsive to the up signal at the differential inputs to provide a positive current at the auxiliary output.

BRIEF DESCRIPTION OF THE DRAWINGS

These and other features and advantages of the present invention will become more apparent to those skilled in the art from the following detailed description in conjunction with the appended drawings in which:

FIG. 1A is a circuit diagram of a prior art differential phase locked loop (PLL);

FIG. 1B is a detailed circuit diagram of a representative phase frequency detector (PFD) of the PLL shown in FIG. 1A;

FIG. 1C is a logic table showing the possible states for the PFD shown in FIG. 1B;

FIGS. 1D-1E are detailed circuit diagrams of alternate representative feedback frequency dividers of the PLL shown in FIG. 1A;

FIGS. 2A-2B are detailed circuit diagrams of a differential phase locked loop (PLL) incorporating an embodiment of the charge pump of the current invention;

FIG. 2C is a logic table showing the possible states for the PFD shown in FIGS. 2A-2B;

DETAILED DESCRIPTION OF THE EMBODIMENTS

Figure 3A:
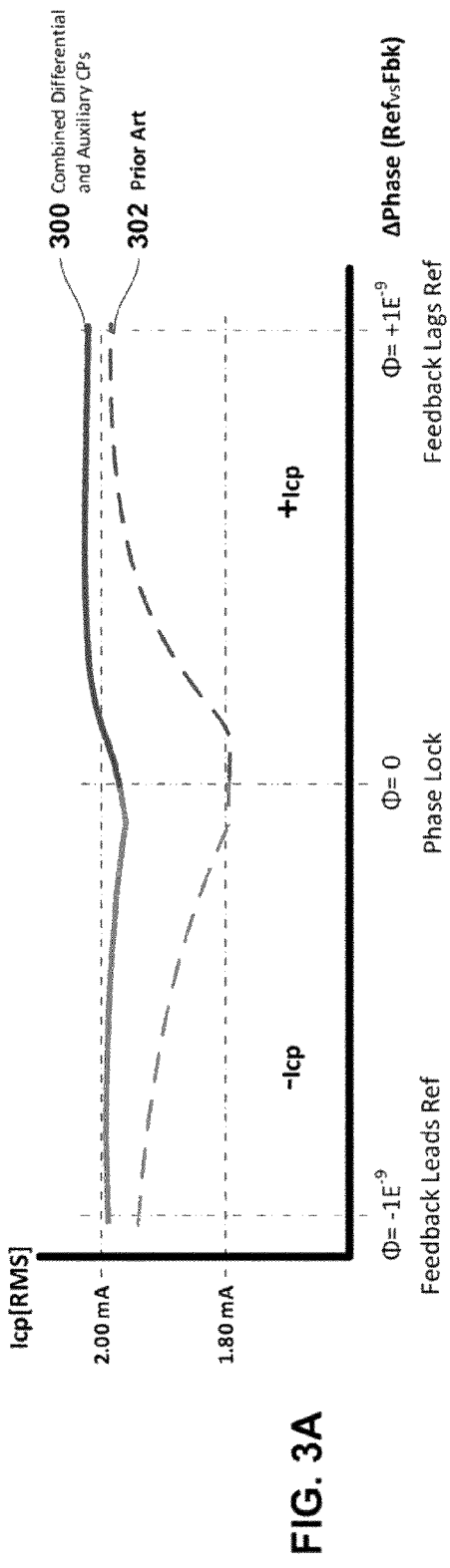
FIG. 3A is a graph comparing the linearity of the output current of the charge pump shown in FIGS. 2A-2B with that of the prior art charge pump shown in FIG. 1A.

FIG. 1A is a circuit diagram of a prior art differential phase locked loop (PLL). The phase locked loop 100 includes: a reference signal source 102, a phase frequency detector (PFD) 110, a charge pump (CP) 120, a low pass filter (LPF) 160, a voltage/current controlled oscillator 170 and a frequency divider 180. The PFD accepts input from the fixed reference signal $F_{Ref}$ from reference signal source 102 at input 111A, as well as the feedback signal $F_{Fbk}$ from the VCO 170 as scaled by the frequency divider 180 at feedback input 111B. The PFD is identified as a differential PFD because it has differential outputs from which an up signal, a down signal, and an off signal are output. The up signal results from the detection of an error condition in which the phase or frequency of the feedback signal lags the phase or frequency of the reference signal. The down signal results from the detection of an error condition in which the phase or frequency of the feedback signal leads the phase or frequency of the reference signal. The off signal occurs in the absence of the up or down signal and becomes more prevalent as the PLL comes into a state in which phase and frequency of the feedback and reference signal are locked. In FIG. 1A the PLL is shown at an instant of time in which an up signal is output by the PFD. The up signal is a differential signal comprising a "1" and a "0" on the up and the down differential outputs respectively. The nomenclature "1" and "0" corresponds to the relative rather than absolute voltage values on the differential outputs at the subject instant of time.

The prior art charge pump 120 operates as a bipolar current source converting the up and down signals from the PFD into positive and negative current pulses which are attenuated by the LPF before driving the VCO in a direction which reduces any measured phase error between the reference signal and feedback signal. The charge pump includes: a current source 154A coupled to a voltage source 152A; a current sink 154B coupled to the voltage sink 152B; and a pair of switches each of which couples to a corresponding one of the differential outputs of the PFD to drive a corresponding one of up and down switches 156A-B respectively. In response to an up signal, switch 156A closes providing positive current 159A at the output 158 of the charge pump and switch 156B opens. In response to a down signal, switch 156A opens and switch 156B closes providing negative current at the CP output 158. The low pass filter 160 includes a capacitor 154 coupled to an electrical ground 152. The low pass filter attenuates, e.g. low pass filters, the up and down current pulses from the charge pump before delivery to the input of the VCO 170. The VCO increases the frequency of its output signal at its output 172 responsive to an increase on voltage/current at its input. Where the VCO output frequency $F_{out}$ is designed to be higher than that of the reference signal $F_{Ref}$ an integer or fractional frequency divider 180 is used in the feedback path between the VCO and the reference input 111B of the PFD.

Inaccuracies in PLL performance result from non-linearity in the performance of any component. Typically charge pump linearity dominates the overall PLL loop linearity. A nonlinear charge pump increases close-in phase noise and fractional spur. Charge pump nonlinearity is mainly caused by up and down current mismatch and a change in output impedance during phase lock. Up and down current mismatch between the charge pump's current source 154A and current sink 154B causes the up and down currents to be unequal. This causes the slope of the current $I_{cp}$ at the output 158 of the charge pump vs the phase error to be unequal, thereby varying phase errors and causing non-linearity.

FIG. 1B is a detailed circuit diagram of a representative phase frequency detector (PFD) 110A of the PLL shown in FIG. 1A. A pair of "D" flip-flops 112A-B, an "AND" gate 114 and a delay 116 are shown. The reference signal $F_{Ref}$ provides a data input to D flip-flop 112A which triggers output Q1 "HI" on a rising edge of the reference signal. The scaled feedback signal $F_{Fbk}$ provides a data input to D flip-flop 112B which triggers output Q2 "HI" on a rising edge of the reference signal. The Q1-Q2 outputs of the D flip-flops form the differential up and down outputs of the PFD. The "AND" gate provides feedback of the Q1-Q2 outputs of the D flip-flops to the Reset/Clear inputs of the D flip-flops so that at any time both the Q1-Q2 outputs are "HI" the D flip-flops are both reset. Thus after a rising edge on one of the $F_{Ref}$ or $F_{Fbk}$ inputs is latched in by a corresponding D flip-flop the next rising edge on the other of the inputs unlatches both D flip-flops. The delay 116 prevents the occurrence of a high impedance state on the outputs.

FIG. 1C is a logic table 118 showing the possible states for the PFD differential outputs, i.e. the up and down outputs shown in FIG. 1B and the resultant charge pump current output Icp. The first row corresponds with a differential up signal with "1" and "0" on the Up and Dn outputs respectively and a resultant positive current provided by the charge pump 120 at output 158. The second row corresponds with a differential down signal with "0" and "1" on the Up and Dn outputs respectively and a resultant negative current provided by the charge pump 120 at output 158. The third row corresponds with a differential off signal with "0" and "0" on the Up and On outputs respectively and a resultant open circuit provided by the charge pump at output 158.

FIGS. 1D-1E are detailed circuit diagrams of alternate representative feedback frequency dividers of the PLL shown in FIG. 1A.

In FIG. 1D a representative integer frequency divider 180A includes a digital divide by "N" circuit 182 which can be implemented with D flip-flops coupled to form a simple binary counter from which a selected one of the most significant bits provides the output of the scaled feedback signal. This type of divider provides an output signal $F_{out}$ which is an integer multiple of the reference signal $F_{Ref}$.

In FIG. 1E a representative fractional frequency divider 180B is shown with integrated dithering capability. Fractional frequency division is provided by a pair of distinctly selectable integer "N1" or "N1+1" frequency dividers 184. The time averaged ratio of the number of times "N1" is chosen as a denominator, vs the number of times "N1+1" is chosen as a denominator determines the frequency at which the VCO stabilizes. The frequency of the locked VCO can be selected by varying the percentage of time the frequency divider spends at the two denominator values. The dithering provided by the delta sigma modulator (DSM) 186 randomizes the selection of either the integer "N1" or "N1+1" digital dividers 184 while maintaining the time-averaged ratios. The scaled feedback signal $F_{Fbk}$ at the output of the dividers 184 is also internally feedback to the DSM to control its operation.

FIGS. 2A-2B are detailed circuit diagrams of a differential phase locked loop (PLL) incorporating an embodiment of the charge pump 220 of the current invention. The PLL 200 in FIGS. 2A-2B includes: a reference signal source 202, a phase frequency detector (PFD) 210, a charge pump (CP) 220, a low pass filter (LPF) 260, a voltage/current controlled oscillator 270 and a frequency divider 280. The PFD accepts input from the fixed reference signal $F_{Ref}$ from reference signal source 202 at input 211A, as well as the feedback signal $F_{Fbk}$ from the VCO 270 as scaled by the frequency divider 280 at feedback input 211B. The PFD is identified as a differential PFD because it has differential outputs from which the up signal, down signal, and off signal are output. The up signal results from the detection of an error condition in which the phase or frequency of the feedback signal $F_{Fbk}$ lags the phase or frequency of the reference signal $F_{Ref}$. The down signal results from the detection of an error condition in which the phase or frequency of the feedback signal leads the phase or frequency of the reference signal. The off signal occurs in the absence of the up or down signal and becomes more prevalent as the PLL comes into a state in which phase and frequency of the feedback and reference signal are locked.

In FIG. 2A the PLL is shown at an instant of time in which a down signal is output by the PFD. The down signal is a differential signal comprising a "0" and a "1" on the up and the down differential PFD outputs respectively. The down signal results in a negative current $-I_{cp}$ 280A at the output 258 of the charge pump. The nomenclature "0" and "1" corresponds to the relative rather than absolute voltage values on the differential outputs at the subject instant of time.

In FIG. 2B the PLL is shown at an instant of time in which an up signal is output by the PFD. The up signal is a differential signal comprising a "1" and a "0" on the up and the down differential PFD outputs respectively. The up signal results in a positive current $+I_{cp}$ 280B at the output 258 of the charge pump.

The charge pump 220 operates as a bipolar current source converting the up and down signals from the PFD into positive and negative current pulses which are attenuated by the LPF 260 before driving the VCO 270 in a direction which reduces any measured phase error between the reference signal $F_{Ref}$ and scaled feedback signal $F_{Fbk}$. The charge pump 220 in this embodiment of the invention includes: a differential charge pump 250 and an auxiliary charge pump 230 which operate together to linearize the output current $I_{cp}$ across all phase and frequencies. The integration of the auxiliary and differential charge pump steers current away from the differential charge pump, and specifically a unity gain buffer portion thereof during switching. This improves the linearity of the charge pump, thus improving the overall PLL performance.

The differential charge pump 250 portion of the charge pump 220 has a primary circuit and a mirror circuit both of which couple in parallel between the current source 254A and the current sink 254B. Current source 254A couples to the voltage source 252A. Current sink 254B couples to the voltage sink 252B. In an embodiment of the invention the current source and sink 254A-B comprise resistors.

The primary circuit of the differential charge pump 250 includes switches 256A-B serially coupled to one another between the current source and sink 254A-254B respectively. The coupling between the two switches themselves comprises the primary output 258. The switches couple either the current source 254A or the current sink to the primary output 258 in response to an up and a down signal respectively from the PFD 210. The opening and closing of switches 256A-256B are controlled by the PFD's differential outputs, specifically the up output and the down output respectively. As shown in FIG. 2B, switch 256A closes when the PFD's Up output="1" providing positive current $+I_{cp}$ 280B at the primary output 258 which is coupled to the low pass filter 260. As shown in FIG. 2A, switch 256B closes when the PFD's Dn output="1" providing negative current $-I_{cp}$ 280A at the primary output 258 and the low pass filter 260.

The mirror circuit of the differential charge pump 250 includes switches 246A-B serially coupled to one another between the current source and sink 254A-254B respectively. The coupling between the two switches themselves comprises the mirror output 248. The switches on the mirror circuit have opposite opening and closing characteristics to their counterparts on the primary circuit. The switches couple either the current source 254A or the current sink to the mirror output 258 in response to the down and the up signal respectively from the PFD 210. The opening and closing of switches 256A-256B are controlled by the PFD's differential outputs, specifically the up output and the down output respectively. As shown in FIG. 2B, switch 246A opens when the PFD's Up output="1" and switch 246B closes when the PFD's Dn output="0" providing negative current 282B at the mirror output 248. As shown in FIG. 2A, switch 246B opens when the PFD's Dn output="1" and switch 246A closes when the PFD's Up output "0" providing positive current 282A at the mirror output 248.

A unity gain buffer 249 of the differential charge pump 250 couples the primary circuit's primary output 258 to the mirror circuit's mirror output 248. In an embodiment of the invention the unity gain buffer comprises an operational amplifier in a unity gain configuration.

The auxiliary charge pump 230 portion of the charge pump 220 includes switches 236A-B serially coupled to one another between the current source and sink 234A-234B respectively. Current source 234A couples to the voltage source 232A. Current sink 234B couples to the voltage sink 232B. In an embodiment of the invention the current source and sink 234A-B comprise resistors. The coupling between the two switches themselves comprises the auxiliary output 238. The switches couple either the current source 234A or the current sink to the auxiliary output 238 in response to an up and a down signal respectively from the PFD 210. The opening and closing of switches 236A-236B are controlled by the PFD's differential outputs, specifically the up output and the down output respectively. Switch 236A closes when the PFD's Up output="1" and switch 236B closes when the PFD's Dn output="1".

In an embodiment of the invention the switches comprise transistors, e.g. MOSFET or BJT with the gate (MOSFET) or base (BJT) coupled to the corresponding one of the PFD's differential outputs. In another embodiment of the invention the switches are CMOS, e.g. a mix of PMOS and NMOS. In another embodiment of the invention the switches may all be PMOS or all NMOS to minimize process variations and maximize current linearity. In this latter embodiment of the invention the up and down outputs of the PFD are each augmented with a parallel inverted output coupled to the corresponding switch on the mirror circuit of the differential charge pump to achieve the opposing switch behavior of the primary and mirror circuit switches coupled to the same one of the PFD's differential outputs.

The low pass filter 260 is coupled to the primary output 258 of the differential charge pump 250. The low pass filter includes a capacitor 264 coupled to an electrical ground 262. The low pass filter attenuates, e.g. low pass filters, the up and down current pulses from the charge pump before delivery to the input of the VCO 270. The VCO increases the frequency of its output signal $F_{out}$ at its output 272 responsive to an increase on voltage/current at its input. Where the VCO output frequency $F_{out}$ is designed to be higher than that of the reference signal $F_{Ref}$ an integer or fractional frequency divider 280 is used in the feedback path between the VCO and the reference input 211B of the PFD, to scale Fout to an integer or rational multiple of the reference signal $F_{Ref}$.

FIG. 2C is a logic table showing the possible states for the PFD differential outputs, i.e. the up and down outputs, and the resultant charge pump current output $I_{cp}$, shown in FIGS. 2A-2B. The first row corresponds with a differential up signal as shown in FIG. 2B, with "1" and "0" on the Up and Dn outputs respectively and a resultant positive current 280B provided by the charge pump 220 at output 258. The second row corresponds with a differential down signal as shown in FIG. 2A with "0" and "1" on the Up and Dn outputs respectively and a resultant negative current 280A provided by the charge pump 220 at output 258. The third row corresponds with a differential off signal with "0" and "0" on the Up and Dn outputs respectively and a resultant open circuit provided by the charge pump at output 258.

FIG. 3A is a graph of root mean square (RMS) charge pump current $I_{cp}$ in milliamps vs phase difference in degrees between the reference and feedback signals. Currents to the left of phase lock are negative and currents to the right of phase lock are positive. The current vs phase performance curve 302 of the prior art charge pump shown in FIG. 1A is non-linear particularly when $F_{Ref}$ and $F_{Fbk}$ are close to phase lock. The current vs phase performance curve 300 of the Applicant's charge pump shown in FIGS. 2A-2B shows a significant improvement in linearity particularly when $F_{Ref}$ and $F_{Fbk}$ are close to phase lock.

Figure 3B:
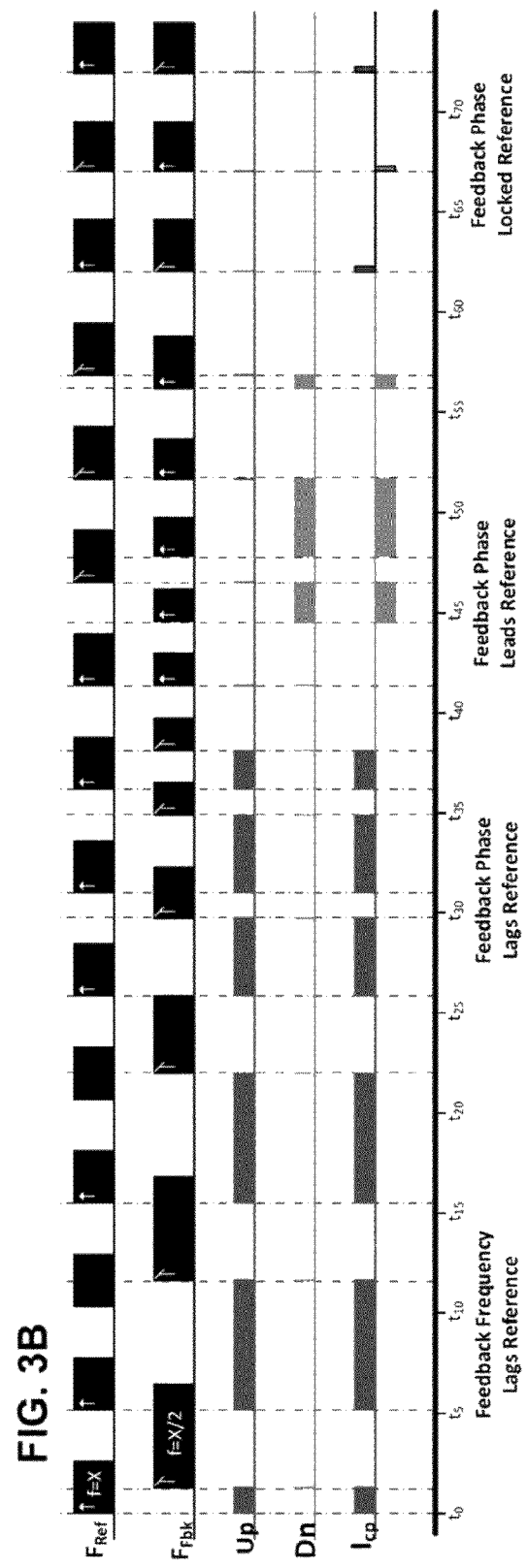
FIG. 3B is a timing diagram showing a representative sequence of frequency and phase locking performed by the phase locked loop incorporating the charge pump of the current invention.

FIG. 3B is a timing diagram showing a representative sequence of frequency and phase locking performed by the phase locked loop shown in FIGS. 2A-B incorporating the charge pump of the current invention. In this example it is assumed that any divide by scaling in the feedback path of the PLL is non-existent or unity. The timing diagrams for the inputs to the PFD, i.e. the reference signal $F_{Ref}$, the scaled feedback signal $F_{Fbk}$, the differential outputs of the PFD, i.e. the Up and Dn outputs, and the resultant output current $I_{cp}$ of the charge pump before low pass filtering are shown over a time interval from t=0 to t=70.

The $F_{Ref}$ and $F_{Fbk}$ timing diagrams include arrow icons, with either solid arrow head or slanted line heads. Where a rising edge with a solid arrow appears on the $F_{Ref}$ timeline the Up output will go positive until a reset of the PFD is triggered by the next rising edge on the $F_{Fbk}$ timeline marked with an arrow with a slanted line head. Conversely, where a rising edge with a solid arrow appears on the $F_{Fbk}$ timeline the Dn output will go positive until a reset of the PFD is triggered by the next rising edge on the $F_{Ref}$ timeline marked with an arrow with a slanted line head.

When the feedback signal triggers more often than resets the PFD either due to leading the reference clock in frequency or in phase, the charge pump current will on average be negative therefore reducing the frequency of the VCO output $F_{out}$ until phase lock is achieved. Conversely, when the feedback signal triggers less often than resets the PFD either due to lagging the reference clock in frequency or in phase, the charge pump current will on average be positive therefore increasing the frequency of the VCO output $F_{out}$ until phase lock is achieved.

Initially, at time t=0 the frequency of the feedback signal $F_{Fbk}$ lags that of the reference signal, e.g. $F_{Fbk}=F_{Ref}/2$. The PFD is triggered more often by the rising edges of the reference signal than the feedback signal, and as a result the Up one of the PFD outputs is more active than the Down one. Thus, over the interval from t=0 to t=25 during which the PLL is correcting for this frequency lag the up one of the PFD's differential outputs is more active than the down, and the capacitor current $I_{cp}$ is positive.

Over the interval t=25 to t=40 the feedback signal is perceived as continuing to lag the reference signal due to what appears to be a phase lag of the feedback clock relative to the reference clock. Thus, over the interval from t=25 to t=40 the PLL is correcting for this perceived phase lag with the Up one of the PFD's differential outputs still more active than the Down, and the capacitor current $I_{cp}$ is still positive, resulting in $F_{Fbk}$ overshooting $F_{Ref}$ in frequency at about t=45.

Over the interval t=45-t=60 the PFD is triggered more often by the rising edges of the feedback signal than the reference signal thus the PFD's Down output is more active than the Up output, and the capacitor current $I_{cp}$ is primarily negative thus reducing the frequency of the VCO's output signal $F_{out}$ until interval starting at t=65 at which phase lock is achieved and a statistically equal set of alternating short duration positive and negative current pulses $I_{cp}$ are delivered by the charge pump.

The components and processes disclosed herein may be implemented a software, hardware, firmware, or a combination thereof including program code software, a memory element for storing the program code software and a hardware processor including registers, logic, and transistor gates for executing the program code software, without departing from the scope of the Claimed Invention.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A charge pump comprising:
   a differential charge pump having differential inputs and primary and mirror outputs, and the differential charge pump responsive to a down signal at the differential inputs to provide a negative current at the primary output and a positive current at the mirror output, and responsive to an up signal at the differential inputs to provide a positive current at the primary output and a negative current at the mirror output;
   an auxiliary charge pump having differential inputs and an auxiliary output coupled to the mirror output of the differential charge pump, and responsive to the down signal at the differential inputs to provide a negative current at the auxiliary output, and responsive to the up signal at the differential inputs to provide a positive current at the auxiliary output
   a negative current source switchably coupled to the auxiliary output responsive to the down signal; and
   a positive current source switchably coupled to the auxiliary output responsive to the up signal.

2. A charge pump comprising:
   a differential charge pump having differential inputs and primary and mirror outputs, and the differential charge pump responsive to a down signal at the differential inputs to provide a negative current at the primary output and a positive current at the mirror output, and responsive to an up signal at the differential inputs to provide a positive current at the primary output and a negative current at the mirror output;
   an auxiliary charge pump having differential inputs and an auxiliary output coupled to the mirror output of the differential charge pump, and responsive to the down signal at the differential inputs to provide a negative current at the auxiliary output, and responsive to the up signal at the differential inputs to provide a positive current at the auxiliary output; and the auxiliary charge pump including:
   a positive voltage source;
   a first resistor coupled to the positive voltage source;

a 1$^{st}$ switch switchably coupling and uncoupling the first resistor to the auxiliary output responsive to the up signal and the down signal respectively;

a negative voltage source;

a second resistor coupled to the negative voltage source;

a 2$^{nd}$ switch switchably coupling and uncoupling the second resistor to the auxiliary output responsive to the down signal and the up signal respectively.

3. A charge pump comprising:

a differential charge pump having differential inputs and primary and mirror outputs, and the differential charge pump responsive to a down signal at the differential inputs to provide a negative current at the primary output and a positive current at the mirror output, and responsive to an up signal at the differential inputs to provide a positive current at the primary output and a negative current at the mirror output;

an auxiliary charge pump having differential inputs and an auxiliary output coupled to the mirror output of the differential charge pump, and responsive to the down signal at the differential inputs to provide a negative current at the auxiliary output, and responsive to the up signal at the differential inputs to provide a positive current at the auxiliary output; and the differential charge pump responsive to an off signal at the differential inputs to provide an open circuit at the primary output.

4. A charge pump comprising:

a differential charge pump having differential inputs and primary and mirror outputs, and the differential charge pump responsive to a down signal at the differential inputs to provide a negative current at the primary output and a positive current at the mirror output, and responsive to an up signal at the differential inputs to provide a positive current at the primary output and a negative current at the mirror output;

an auxiliary charge pump having differential inputs and an auxiliary output coupled to the mirror output of the differential charge pump, and responsive to the down signal at the differential inputs to provide a negative current at the auxiliary output, and responsive to the up signal at the differential inputs to provide a positive current at the auxiliary output; and the auxiliary charge pump responsive to an off signal at the differential inputs to provide an open circuit at the auxiliary output.

\* \* \* \* \*